United States Patent [19]

Chao

[11] Patent Number: 5,478,762
[45] Date of Patent: Dec. 26, 1995

[54] METHOD FOR PRODUCING PATTERNING ALIGNMENT MARKS IN OXIDE

[75] Inventor: Ying-Chen Chao, Hsin-Chu, Taiwan

[73] Assignee: Taiwan Semiconductor Manufacturing Company, Hsinchu, Taiwan

[21] Appl. No.: 405,076

[22] Filed: Mar. 16, 1995

[51] Int. Cl.⁶ .............................................. H01L 21/8238
[52] U.S. Cl. ........................ 437/34; 437/10; 148/DIG. 24
[58] Field of Search ................................. 437/10, 12, 34, 437/57; 148/DIG. 24, DIG. 60

[56] References Cited

U.S. PATENT DOCUMENTS 4,548,654 10/1985 Tobin ........................................ 437/10
4,661,166 4/1987 Hirao ........................................ 437/12
5,094,963 3/1992 Hiraguchi et al. ............... 148/DIG. 24
5,194,395 3/1993 Wada ........................................ 437/10

Primary Examiner—Chandra Chaudhari
Attorney, Agent, or Firm—George O. Saile

[57] ABSTRACT

A process for fabricating MOSFET devices, in which a denuded zone in silicon has been created during the normal process sequence, has been developed. In order to avoid the formation of deleterious oxygen precipitates, prior to the creation of the denuded zone, low temperature processing had to be used. Low temperature insulator depositions were used for the alignment mark formation, as well as for the fill for the field oxide regions. Subsequently, high temperature well formation activation anneals, resulted in the creation of the denuded zone, and thus removed the low temperature restriction for the remaining processing steps.

22 Claims, 3 Drawing Sheets

METHOD FOR PRODUCING PATTERNING ALIGNMENT MARKS IN OXIDE

BACKGROUND OF THE INVENTION

1. Field of the Invention

The present invention relates to a fabrication technique for semiconductor integrated circuits, and more specifically to the process needed to obtain the alignment marks necessitated by the use of specific photolithographic exposure tools.

2. Description of Prior Art

The trend in the semiconductor chip industry has been to produce faster devices at reduced costs. The ability of the industry to meet these objectives has been influenced in part by the success of the industry to fabricate smaller chips, exhibiting improved performance due to the decreased delay times, and lower costs, arising from the ability of placing more of these smaller chips on a wafer. The reduction in chip size, accomplished via reductions in specific chip image dimensions, has been realized by the rapid advances in the photo lithographic discipline. Improvements in exposure cameras, as well as developments enabling the use of more sensitive photoresist materials, have allowed smaller chip images to be obtained, thus reducing chip size and increasing circuit density. However placing more devices on a chip reduces the chances of sustaining, or improving the chip yield, due to the increased active device area on a specific chip. Therefore the semiconductor industry has also concentrated on methods needed to increase chip yield.

The objective of improving chip yield has been addressed in basically two manners. First the fabrication disciplines, such as low pressure chemical vapor deposition, (LPCVD), ion implantation, (I/I), etc, have created better processes and equipment which add less defects to the chip fabrication process. The ability of these disciplines to avoid contamination, the in process wafer, via particle contamination, etc, has allowed higher yields to be realized. Secondly, device engineers have created fabrication techniques which minimize the creation of silicon damage, during the fabrication process. For example, high energy, high dose, ion implantation processes, can leave damaged regions in silicon, thus creating areas of device vulnerability and subsequent yield loss. For this case processes have been developed in which the relationships between defect generation and implant conditions are understood, and thus deleterious conditions are avoided, or anneal cycles have been added at the conclusion of the implant cycle, to relax the damage.

Another defect mode, due to silicon damage, is the health of the silicon wafer, prior to the initial processing sequences. Silicon wafers, obtained from crystals grown by the Czochralski method, can exhibit supersaturated interstitial oxygen, which in turn can percipitate at the wafer surface during routine fabrication processes at temperatures in the range of about 900° C. These percipitates may grow large enough at the wafer surface to result in crystal defects, dislocation loops, etc, thus interfering with normal device functioning, thus resulting in ultimate yield loss. Methods have been developed in which the starting wafer is subjected to a series of heat cycles, in an attempt to remove oxygen from an area of the wafer where the devices are to be fabricated. This area is known as the denuded zone, that is an area in which the deleterious oxygen has been reduced or removed, and the ability to produce high yielding devices is increased. Hirao, etal, in U.S. Pat. No. 4,661,166, describe a process in which a series of heat treatments are used to produce a denuded zone near the wafer surface. In addition this invention offers the advantage of creating another zone, below the denuded zone, which consists of a silicon structure that acts as gettering sites for other impurities, such as metals, etc, which can also degrade device yield if left to diffuse to the wafer surface.

These processes used to initially create a denuded zone in the starting wafer, although successful in reducing defect related yield loss, are costly. A method will now be described in which a process sequence is invented in which the denuded zone will be created during the ongoing process. This fabrication sequence will use no additional steps, and thus cost reductions, as well as increased chip yields, due to defect free denuded zones, will be realized. The major direction used in this invention will be to avoid any process temperature step, that will lead to oxygen percipitate formation at the wafer surface, prior to formation of the denuded zone. Thus prior to creating the denuded zone, during a 1100°–1200° C. cycle, all insulator layers will be obtained via low temperature chemical vapor deposition processes.

SUMMARY OF THE INVENTION

It is an object of this invention to provide a process for fabricating metal oxide semiconductor field effect transistors, (MOSFET) on a silicon wafer, in which a denuded zone in the wafer, is created during the normal processing sequence.

It is another object of this invention to provide a process for fabricating MOSFET devices in which temperature, that result in oxygen precipitate formation, are avoided until the denuded zone has been created.

It is yet another object of this invention to use a low temperature chemically deposited oxide, for pattening of photolithographic alignment marks, prior to formation of the denuded zone in the silicon wafer, to avoid oxygen precipitate formation that would occur if a higher temperature thermal oxide had been used.

In accordance with this present invention, a method is described for fabricating MOSFET devices, in which a denuded zone is created during the normal processing sequence, and avoiding oxygen precipitate formation, prior to the creation of the denuded zone, by employing low temperature insulator formation techniques. A low temperature chemically vapor deposited layer is formed on the silicon surface and pattern to result in the desired alignment marks needed for the photolithographic process. After the alignment mark creation, N wells, for P type field effect transistors, (PFET), and P wells for NFET devices are created via photolithographic, ion implantation, and high temperature anneal processing. The high temperature anneal creates the denuded zone in the wafer, and increases the chance of high yielding, complimentary MOSFET devices to obtained. The device is completed by growing a gate oxide, depositing and patterning polysilicon to form the gate and creating the source and drain regions.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method for forming zero level photolithographic alignment marks in silicon, and creating a MOSFET device fabrication process in which a defect free denuded zone in silicon is established via specific processing conditions, will now be described in detail.

Figure 1:
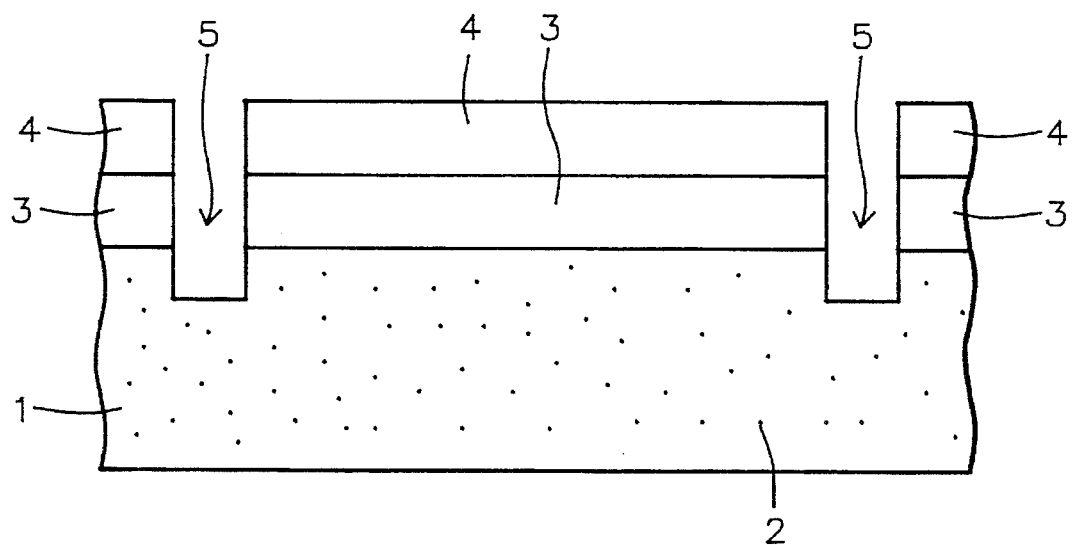
FIG. 1, which schematically shows a silicon wafer at the stage of fabrication where the zero level photolithographic alignment marks have been created, without yet forming the denuded zone.

FIG. 1 shows the creation of zero level alignment mark, needed for specific step and repeat exposure cameras. A substrate, 1, composed of P type, single crystal silicon, with a [100] orientation is used. The silicon wafers, sliced from a crystal grown using the Czochralski method normally contains supersaturated oxygen, distributed throughout the wafer and illustrated as 2, in FIG. 1. The oxygen residing in substrate, 1, if subjected to processing treatments, such as thermal oxidations at temperatures in the range of 900° C., could form precipitates near the silicon wafer surface, where subsequent devices will be created. Consequently these oxygen precipitates can getter metallic impurities from the bulk of the substrate, resulting in crystal damage near the silicon surface, and ultimately result in leaky or defective devices. Therefore it is imperative to establish a process sequence that forms a denuded zone, (oxygen free), at the silicon surface, prior to forming the defect sensitive NFET and PFET devices at the silicon surface. Therefore the insulator layers needed, prior to the creation of the denuded zone, should be obtained via low temperature chemical vapor deposition, (LPCVD), techniques, to avoid deleterious precipitate formation. This strategy is shown by using a LPCVD layer, 3, grown at a temperature between about 300° to 800° C., to a thickness between about 250° to 1000° Angstroms. Photoresist image, 4, and patterning of the oxide layer, 3, and underlying silicon, via reactive ion etch procedures are used to create the global alignment marks needed for the photoresist exposure camera. The reactive ion etching of oxide layer, 3, was accomplished using CF4, while SF6 was used to create the desired mark pattern, 5, in silicon. The use of the LPCVD process, instead of a thermal oxide sequence, prevented the formation of precipitates at the wafer surface.

Figure 2:
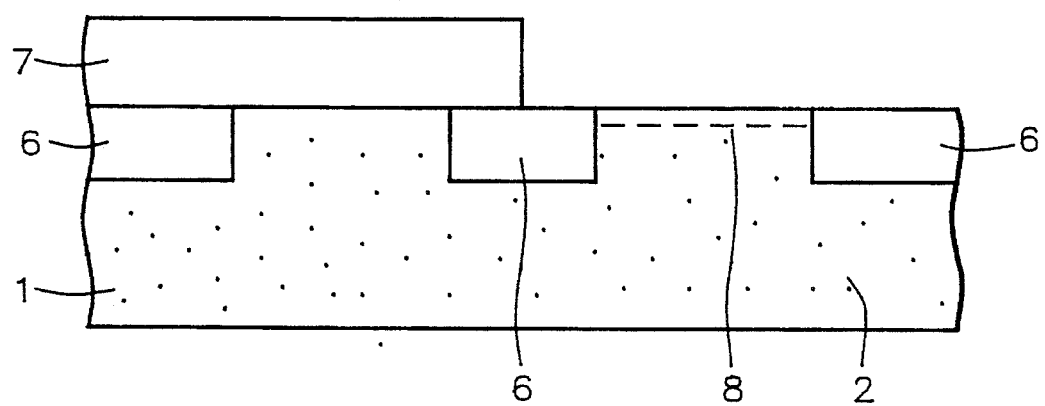
FIGS. 2–4, schematically showing fabrication stages in which P well and N well areas have been created, as well as the formation of a denuded zone in silicon.
Figure 3:
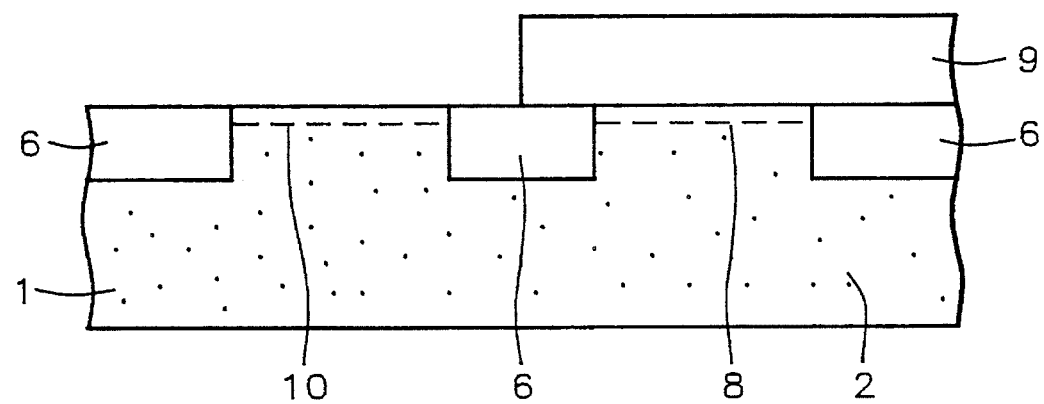
Figure 4:
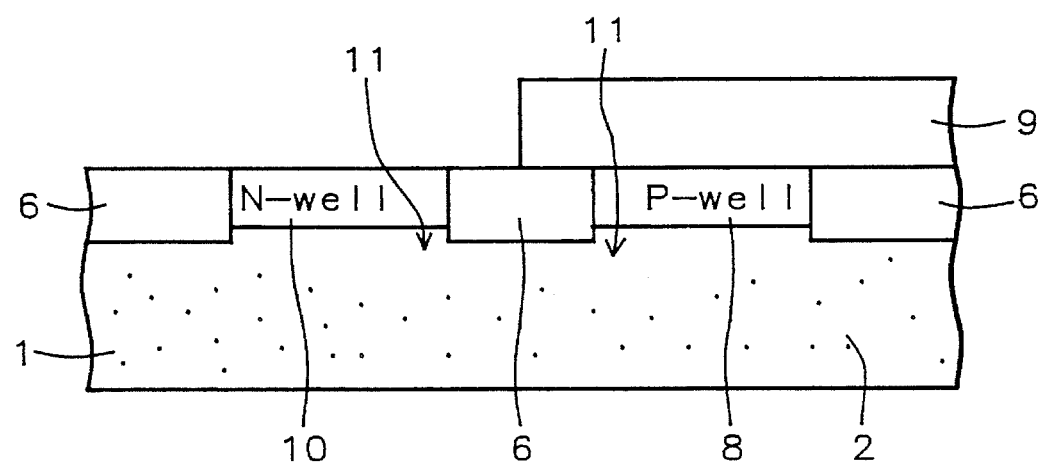

FIG. 2 shows an initial stage of the creation of a P well in the silicon substrate, 1. First a isolation region, 6, needs to be formed to ultimately provide device isolation. Briefly the structure chosen is a oxide filled trench, with the oxide again being obtained via LPCVD processing. The low temperature insulator process again avoids the formation of the damaging oxygen precipitates. Photoresist patterning, 7, is then used to block the non-P well regions. An ion implantation step is then performed using boron at an energy between about 80° to 120° Kev., at a dose between about 5E12 to 2E13 atoms/cm2. The unactivated, P type dopants, 8, are shown in FIG. 2. FIG. 3 shows a similar process sequence used to the form the N well region. Photoresist patterning, 9, blocks the P well region from the ion implantation of phosphorous, at an energy between about 80 to 180 Kev., at a dose between about 5E12 to 2E13 atoms/cm2. The unactivated N type dopants, 10, are shown in FIG. 3. After photoresist removal, the activation process, needed to form the final P and N well, is performed at a temperature between about 1100° to 1200° C., for a time between about 60 to 500 min., in an O2—N2 ambient. This heat cycle now results in a release of oxygen, in the area near the wafer surface, creating the denuded zone, shown as region 11, in FIG. 4. This region is between about 5 to 50 uM in thickness. The region below the denuded zone, has formed large oxygen precipitates, and can supply gettering properties. That is metallic impurities, residing somewhere in the silicon wafer, will be attracted to this region, away from the subsequent device region in the denuded zone, and thus enable higher yielding structures to be created. Again it should be noted that if thermal oxidations at temperatures between 850° to 1000° C. would have previously been used for the alignment mark mask, or for the isolation process, the large oxygen precipitates may have formed at the surface, prior to the creation of the denuded zone.

Figure 5:
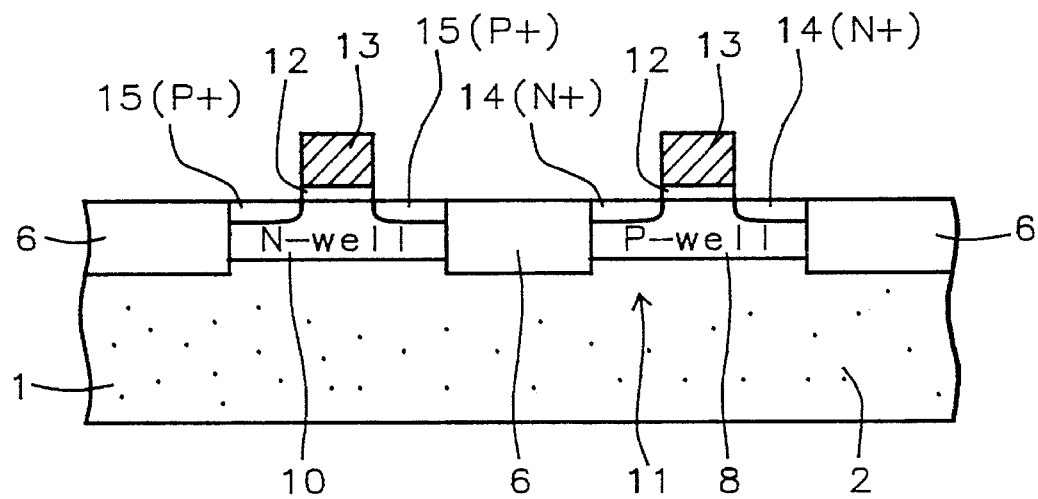
FIGS. 5–6, schematically showing the final stages of fabrication for both NFET and PFET devices, residing in the denuded zone of the silicon.
Figure 6:
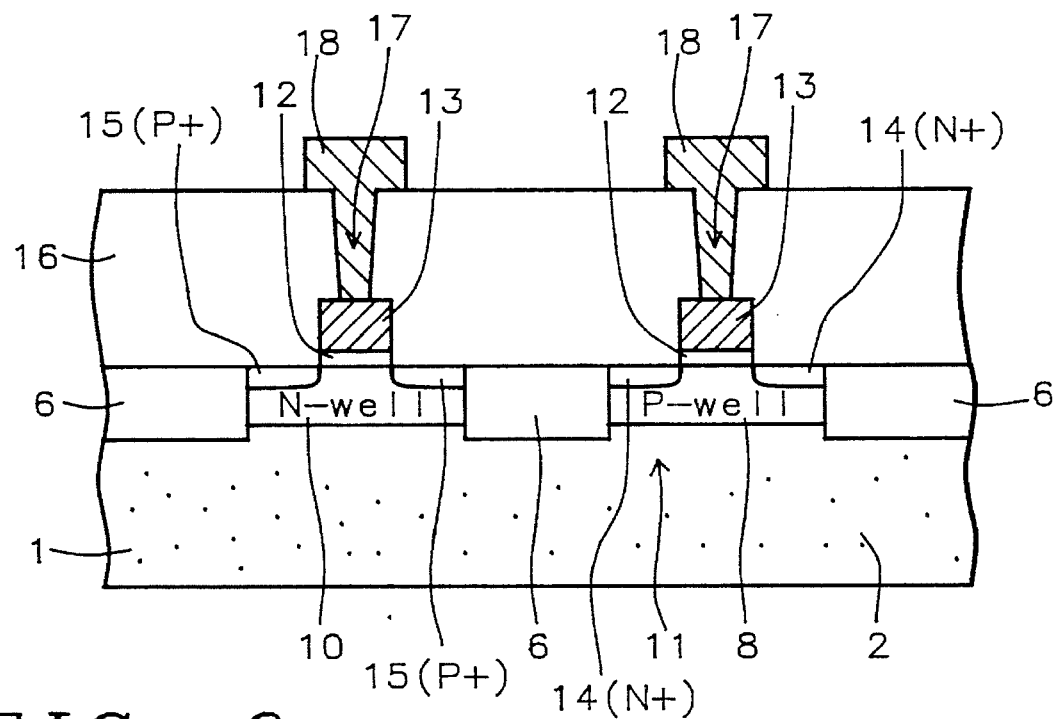

FIGS. 5–6, schematically illustrate the final fabrication stages of a complimentary MOSFET, (CMOS), device. The temperature now used for the completion of processing is not as critical as temperatures used prior to the denuded zone creation. Therefor, referring to FIG. 5, a gate oxide, 12, is grown at a temperature between about 800° to 950° C. to a thickness between about 80° to 150° Angstroms. Polysilicon gates are formed by LPCVD, ion implantation doping, and patterning, using conventional photolithographic and reactive ion etching procedures, resulting in gate structures, 13. Standard photoresist blockout patterning is then performed to allow the source and drain regions, 14, for the NFET device, to be created via ion implantation of arsenic, at an energy between about 60 to 90 Kev.,, at a dose between about 2E15 to 6E15 atoms/cm2. The blockout pattern is then reversed to allow the PFET source and drain regions, 15, to be formed, via ion implantation of BF2 at an energy between about 50 to 100 Kev., at a dose between about 2E15 to 6E15 atoms/cm2. It can be seen in FIG. 5, that the device is contained in the denuded zone area, 11.

FIG. 6 illustrates the metallized CMOS device. A LPCVD oxide, 16, is deposited, followed by standard photolithographic and reactive ion etching processes to obtain contact holes, 17, to the polysilicon gates, 13, and to the source and drain regions, (not shown in FIG. 6), of the PFET and NFET devices. Aluminum metallization is then patterned to create contacts 18, to the polysilicon gates.

This process for creating alignment mark patterns by growing insulator films at temperatures not deleterious to the creation of denuded zones in silicon, although shown applied to CMOS structures, can also be used for the fabrication of BiCMOS chips.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device on a silicon, semiconductor substrate, in which a denuded zone in silicon, is created during the normal processing sequence that consists of:

depositing a first insulator film on said silicon substrate;

forming a pattern in said insulator film, and in said silicon, to be used for photolithographic alignment procedures;

creating a region in said silicon to be used for device isolation;

depositing second insulator film in said region used for device isolation;

photoresist patterning to expose a first specific region of said silicon;

ion implanting a first conductivity imparting dopant into said first exposed region of said silicon;

photoresist patterning to expose a second specific region of said silicon:

ion implanting a second conductivity imparting dopant into said second exposed region of said silicon;

annealing to activate said first conductivity imparting dopant, second conductivity imparting dopant, while creating a denuded zone in said silicon substrate;

growing a gate oxide on said first exposed silicon region, and on said second exposed silicon region;

depositing a polysilicon layer on said gate oxide, and on said oxide region used for isolation;

patterning to form polysilicon gate structures on said gate oxide, in said first exposed silicon region, and in said second exposed silicon region;

photoresist patterning to expose said first specific region of said silicon;

ion implanting a third conductivity imparting dopant into said first exposed region of said silicon, and into said polysilicon gate structures;

photoresist patterning to expose said second specific region of said silicon; and ion implanting a fourth conductivity imparting dopant into said second exposed region of said silicon, and into said polysilicon gate structures.

2. The method of claim 1, wherein said first insulator layer, used for photolithographic alignment mark creation is silicon oxide, grown using low pressure chemical vapor deoosition, (LPVCD), at a temperature between about 300° to 800° C., to a thickness between about 250 to 1000 Angstroms.

3. The method of claim 1, wherein said region, used for device isolation, is created by reactive ion etching of silicon using SF6.

4. The method of claim 1, wherein said region, used for device isolation, is filled with a second insulator layer, silicon oxide, deposited using LPCVD, at a temperature between about 300° to 800° C., to a thickness between about 3000 to 6000 Angstroms.

5. The method of claim 1, wherein said first conductivity imparting dopant is boron, ion implanted at an energy between about 80 to 120 Kev., at a dose between about 5E12 to 2E13 atoms/cm2.

6. The method of claim 1, wherein said second conductivity imparting dopant is phosphorous, ion implanted at an energy between about 80 to 180 Kev., at a dose between about 5E12 to 2E13 atoms/cm2.

7. The method of claim 1, wherein annealing of said first conductivity imparting dopant, and said second conductivity imparting dopant is performed at a temperature between about 1100° to 1200° C., for a time between about 60 to 500 min., in an O2—N2 ambient.

8. The method of claim 1, wherein said denuded zone in said silicon, extends downward from the surface of said silicon to a depth of between about 5 to 50 uM.

9. The method of claim 1, wherein said gate oxide is grown at a temperature between about 800° to 950° C., to a thickness between about 80 to 150 Angstroms.

10. The method of claim 1, wherein said third conductivity imparting dopant is arsenic, ion implanted at an energy between about 60 to 90 Kev., at a dose between about 2E15 to 6E15 atoms/cm2.

11. The method of claim 1, wherein said fourth conductivity imparting dopant is BF2, ion implanted at an energy between about 50 to 100 Kev., at a dose between about 2E15 to 6E15 atoms/cm2.

12. A method for fabricating a MOSFET device, on a silicon semiconductor substrate, in which low temperature processing is employed, until the creation of a denuded zone in silicon has been created, comprising the steps of:

depositing a low temperature, first insulator film on said silicon substrate;

creating an oxide region in said silicon to be used for device isolation;

depositing a low temperature, second insulator film in said region used for device isolation;

photoresist patterning to expose a first region in said silicon, to be used for P well creation;

ion implanting a first conductivity imparting dopant into said first exposed region in said silicon, to be used for P well creation;

photoresist patterning to expose a second region in said silicon, to be used for N well creation.

ion implanting a second conductivity imparting dopant into said second exposed region in said silicon, to be used for N well creation;

annealing to activate said first conductivity imparting dopant, creating a P well region, second conductivity imparting dopant, creating an N well region, while driving out oxygen from the surface of said silicon substrate to create a denuded zone in said silicon substrate;

growing a gate oxide on exposed regions of said P well and said N well;

depositing a polysilicon layer on said gate oxide, and on said oxide region used for device isolation;

patterning to form polysilicon gate structures on said gate oxide, in said P well and said N well regions;

photoresist patterning to expose said P well region;

ion implanting a third conductivity imparting dopant into said P well region, to create N type source and drain regions, and into exposed said polysilicon gate structures;

photoresist patterning to expose said N well region; and ion implanting a fourth conductivity imparting dopant into said N well region, to create P type source and drain regions, and into exposed said polysilicon gate structures.

13. The method of claim 12, wherein said low temperature, first insulator, used for photolithographic alignment mark creation, is silicon oxide, grown using LPCVD, at a temperature between about 300° to 800° C., to a thickness between about 250 to 1000 Angstroms.

14. The method of claim 12, wherein said region, used for device isolation, is created by reactive ion etching of silicon, using SF6.

15. The method of claim 12, wherein said region used for device isolation is filled with a second insulator layer, silicon oxide, deposited using LPCVD, at a temperature between about 300° to 800° C., to a thickness between about 3000 to 6000 Angstroms.

16. The method of claim 12, wherein said first conductivity imparting dopant, used to create a P well region in said silicon, is boron, ion implanted at an energy between about 80 to 120 kev., at a dose between about 5E12 to 2E13 atoms/cm2.

17. The method of claim 12, wherein said second conductivity imparting dopant, used to create an N well region in said silicon, is phosphorous, ion implanted at an energy between about 80 to 180 Kev., at a dose between about 5E12 to 2E13 atoms/cm2.

18. The method of claim 12, wherein annealing of said first conductivity imparting dopant, and second conductivity imparting dopant, is performed at a temperature between about 1100° to 1200° C., for a time between about 60 to 500 min., in an O2—N2 ambient, to activate dopants in said P well region activate dopants in said N well region, and create said denuded zone in said silicon.

19. The method of claim 12, wherein said denuded zone in said silicon, extends downward from the surface of said silicon to a depth in said silicon between about 5 to 50 uM.

20. The method of claim 12, wherein said gate oxide is grown at a temperature between about 800 to 150 Angstroms.

21. The method of claim 12, wherein said third conductivity imparting dopant, used to create the N type source and drain regions, in the said P well region, is arsenic, ion implanted at an energy between about 60 to 90 Kev., at a dose between about 2E15 to 6E15 atoms/cm2.

22. The method of claim 12, wherein said fourth conductivity imparting dopant, used to create the P type source and drain regions, in the said N well region, is BF2, ion implanted at an energy between about 50 to 100 Kev., at a dose between about 2E15 to 6E15 atoms/cm2.

* * * * *